United States Patent [19]
Merrill

[11] Patent Number: 5,320,226
[45] Date of Patent: Jun. 14, 1994

[54] REVERSIBLE SNAP DOME CONTAINER PACKAGE

[76] Inventor: Kenneth V. Merrill, 1353 Marsten Rd., Burlingame, Calif. 94010

[21] Appl. No.: 988,204

[22] Filed: Dec. 9, 1992

[51] Int. Cl.$^5$ .............................................. B65D 85/38
[52] U.S. Cl. ................................. 206/521; 206/328; 206/814
[58] Field of Search ................................ 206/328–334, 206/521, 522, 591, 592, 814

[56] References Cited

U.S. PATENT DOCUMENTS

| | | | |
|---|---|---|---|
| 3,999,661 | 12/1976 | Jones | 206/591 |
| 4,093,068 | 6/1978 | Smrt | 206/592 |
| 4,096,364 | 6/1978 | Lynn et al. | 200/5 A |
| 4,122,964 | 10/1978 | Morris | 215/260 |
| 4,128,744 | 12/1978 | Seeger | 200/5 A |
| 4,138,711 | 2/1979 | Bremenour et al. | 361/424 |
| 4,158,408 | 6/1979 | Thiessen | 206/443 |
| 4,386,388 | 5/1983 | Beun | 361/399 |
| 4,418,820 | 12/1983 | Nagle et al. | 206/334 |
| 4,430,531 | 2/1984 | Wright | 200/5 A |
| 4,593,813 | 6/1986 | Powel | 206/328 |
| 4,659,881 | 4/1987 | Dowe | 200/5 R |
| 4,703,139 | 10/1987 | Dunlap | 200/76 |
| 4,706,812 | 11/1987 | Spinelli et al. | 206/332 |
| 4,765,498 | 8/1988 | Rafferty | 215/230 |
| 4,865,197 | 9/1989 | Craig | 206/522 |
| 4,916,275 | 4/1990 | Almond | 200/516 |
| 4,933,522 | 6/1990 | Celander | 200/513 |
| 5,092,459 | 3/1992 | Uljanic et al. | 206/328 |

Primary Examiner—Jimmy G. Foster
Attorney, Agent, or Firm—Donald C. Feix; Thomas C. Feix

[57] ABSTRACT

A container package for shipping and storing handling-sensitive items. The container package is constructed of clear flexible plastic sheet material and includes a matingly engageable pair of top and bottom half container half portions. Each container half portion includes a plurality of reversible snap domes disposed along the outer surfaces thereof which are movable between a first convex outward position and a second concave inward position upon depression. When depressed into the container package, the snap domes engage underlying portions of an enclosed article or occupy vacant space and thereby restrain the enclosed article from movement in the vertical and lateral directions. In one embodiment, the container half portions are formed as support tray members connected together in clam shell fashion for containing a printed circuit board. The plastic material is provided with additional electrostatic dissipation protection in accordance with known techniques. The snap domes may be arranged uniformly on both tray surfaces or in any random fashion as desired. An alternate embodiment includes provision of a compound snap dome wherein a second smaller snap dome is concentrically-mounted to a larger base snap dome. In another embodiment, the container package is formed as a box and includes snap domes formed in both vertical and horizontal side surfaces.

14 Claims, 5 Drawing Sheets

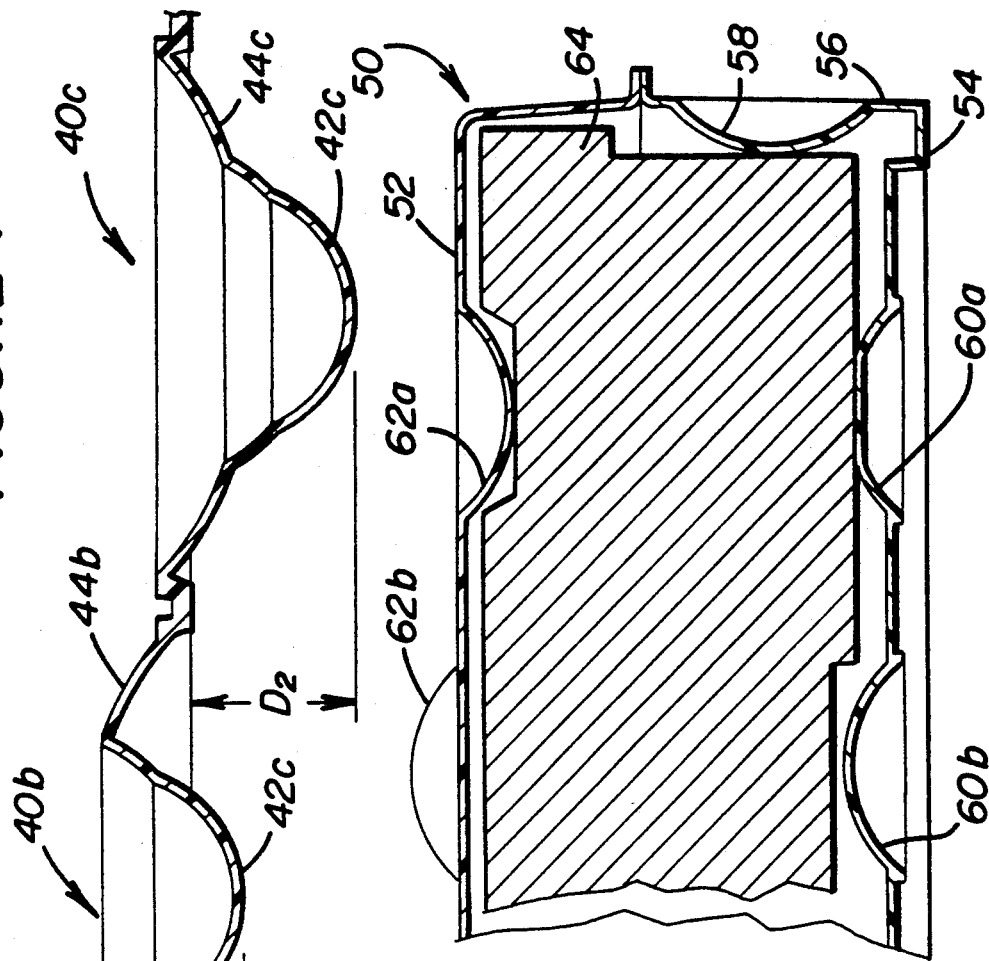
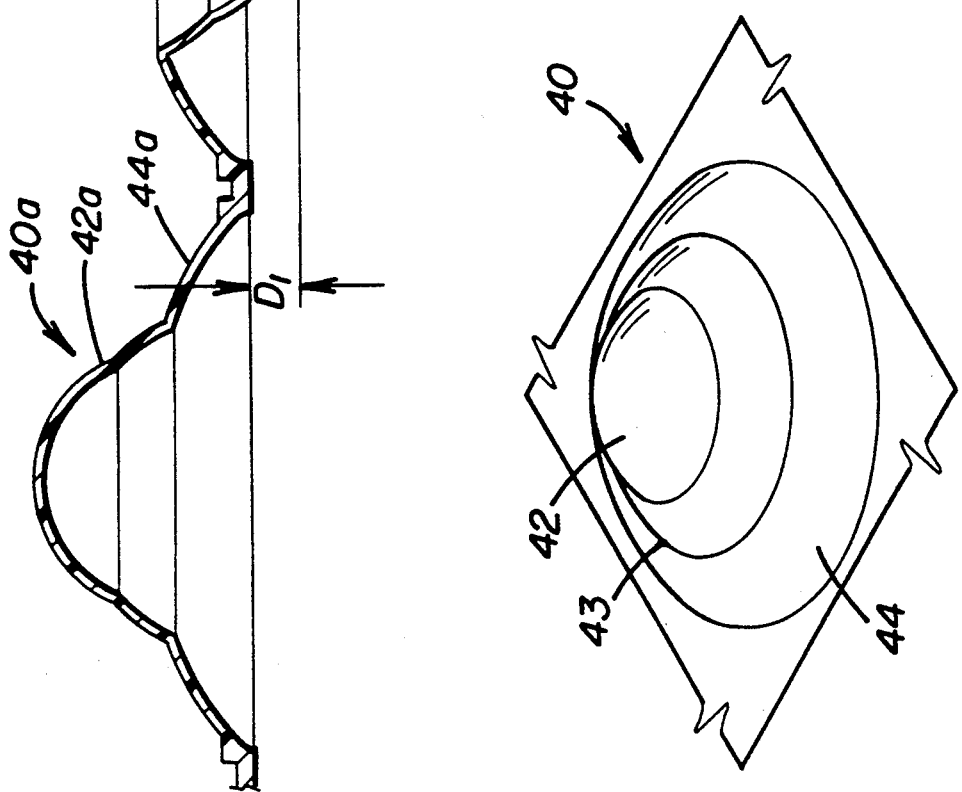

REVERSIBLE SNAP DOME CONTAINER PACKAGE

FIELD

The present invention relates to a protective storage and shipping container package for handling-sensitive items such as printed circuit boards, disk drives, and the like.

BACKGROUND

For several years now it has been the common practice to package delicate handling-sensitive items, such as, for example, printed circuit boards, within an antistatic plastic bag which, in turn, is surrounded by a generous layer of protective foam and then is placed within a corrugated cardboard box. This bag within a foam box packaging scheme, while providing adequate protection for shipping and storage, suffers from several disadvantages. The principle disadvantage is the danger of exposure of the printed circuit board to dust contaminates and potential electrostatic charges each time the printed circuit board is removed from the packaging for inspection. The printed circuit board may undergo visual inspection several times during the shipping process to check for physical damage and to verify that the product indicated on the outer label is the same as that contained within the package. This problem is not inconsiderable especially since the product may also be inspected a number of times at the distributor and/or the retail level for purposes of inventory and display before it finds its way to the end user or for use out in the field.

Further, the bag within a foam box packaging technique is wasteful of resources and does not encourage recycling since the metal leads protruding from the bottom surface of the printed circuit boards often penetrate and tear the surrounding plastic bag material rendering them unusable for repackaging. Similarly, the foam layer and cardboard boxes are easily torn and subject to rapid wear and tear during shipping, handling and opening for inspection.

As an alternative, another technique for packaging printed circuit boards involves the use of specially constructed impact resistant container housings which include tracks or slots formed along the inside end walls and/or upstanding side walls of the container. The tracks are sized for receiving the side edges of the printed circuit board such that the board is suspended horizontally within the container. These containers are typically constructed of conductive carbon filled polymeric material in order to provide a "Faraday Cage" and include an openable end door to permit access for testing and "burning in" of the printed circuit boards while still in the container. An example of such a specially constructed protective container is disclosed in U.S. Pat. No. 4,593,813 issued to Stephen S. Powell. Such specially constructed housings are expensive to manufacture. This increased packaging cost is typically passed along to the consumer. Further, the printed circuit board must still be removed from the protective container for visual inspection.

Accordingly there is a definite need in the art for an improved low cost container package for handling-sensitive articles, such as a printed circuit board, which permits visual inspection of the article contained therein and which is adaptable to the size of the article to be packaged so that one size container may be used for different sized articles.

THE INVENTION

Objects

It is therefore a primary object of the present invention to provide a simple low cost container package for the shipment and storage of printed circuit boards which is constructed of a transparent plastic having good electrical resistivity and which is adaptable to the size of the board to be packaged.

It is another object of the present to provide a container package for printed circuit boards of the type described which includes reversible snap domes provided to the package walls which, when depressed, act as buffers to restrain the board contained within the container package from movement in the vertical and lateral directions.

It is a further object of the present invention that the packaging material is also provided with electrostatic discharge or electrostatic dissipation protection.

It is another object of the invention to provide a package container of the type described which is recyclable and reusable.

It is another object of the invention to provide a container package of the type described which includes cooperating top and bottom surface configurations which permit vertical stacking of adjacent package units in interlocking fashion.

SUMMARY

Briefly, the present invention is directed to a generally box-like storage container for handling-sensitive items constructed of clear flexible plastic sheet material and including a matingly engageable pair of top and bottom container half portions. Each container half portion includes a plurality of reversible snap domes disposed along the outer surfaces thereof which are movable between a first convex outward position and a second concave inward position upon selecting depression. When depressed into the container package, the snap domes either directly engage underlying portions of an enclosed article or occupy dead space and thereby restrain the enclosed article from movement in the vertical and lateral directions.

In one embodiment, the container half portions are formed as support tray members connected together in clam shell fashion for containing a printed circuit board. The preferred material of construction is a flexible plastic having good transparency and electrical resistivity. Preferred plastics include, but are not limited to, polyvinyl chloride (PVC), and polyethylene Terephthalate (PET). Alternately, other known clear plastics may be used and may be internally impregnated or topically coated with a desired electrostatic dissipation protection in accordance with know techniques. The preferred plastic is also bar code permeable such that the container package does not need to be opened for inventory procedures. In this way, the potential exposure of the printed circuit board to potentially damaging electrostatic forces, dust and other contaminants is substantially reduced.

The snap domes may be arranged uniformly on both tray surfaces or in any random fashion as desired. The snap domes may be of any variety of sizes and may optionally include a second smaller concentrically-mounted snap dome (compound snap dome) to provide an additional degree of height positioning when depressed into the container package. The upper and lower trays of the container package preferably each include upraised rib structures, off set from one another, which cooperate to permit top-on-bottom interlocking vertical stacking of the container packages.

An advantage of the present invention is that the snap domes may be selectively depressed in order to take up dead space and therefore permit the container package to be adapted to a PC board having a smaller size footprint.

A further advantage of the present invention is that the container package permits the consumer to view the product contained therein and thus enhances marketability of the product in the package.

These and other objects and advantages of the present invention will become apparent to those skilled in the art from the following detailed description, drawings and appended claims.

DRAWINGS

FIG. 6 is an enlarged isometric view of an alternate embodiment for a compound snap dome of the present invention.

FIG. 7 is a side elevation view of the alternate embodiment compound snap dome illustrating three positional modes of operation.

FIG. 8 is an enlarged fragmentary cross-section side elevation view illustrating a third embodiment of the container package of the present invention.

DETAILED DESCRIPTION OF THE BEST MODE

The following detailed description illustrates the invention by way of example, not by way of limitation of the principles of the invention. This description will clearly enable one skilled in the art to make and use the invention, and describes several embodiments, adaptations, variations, alternatives and uses of the invention, including what we presently believe is the best mode of carrying out the invention.

Figure 1:
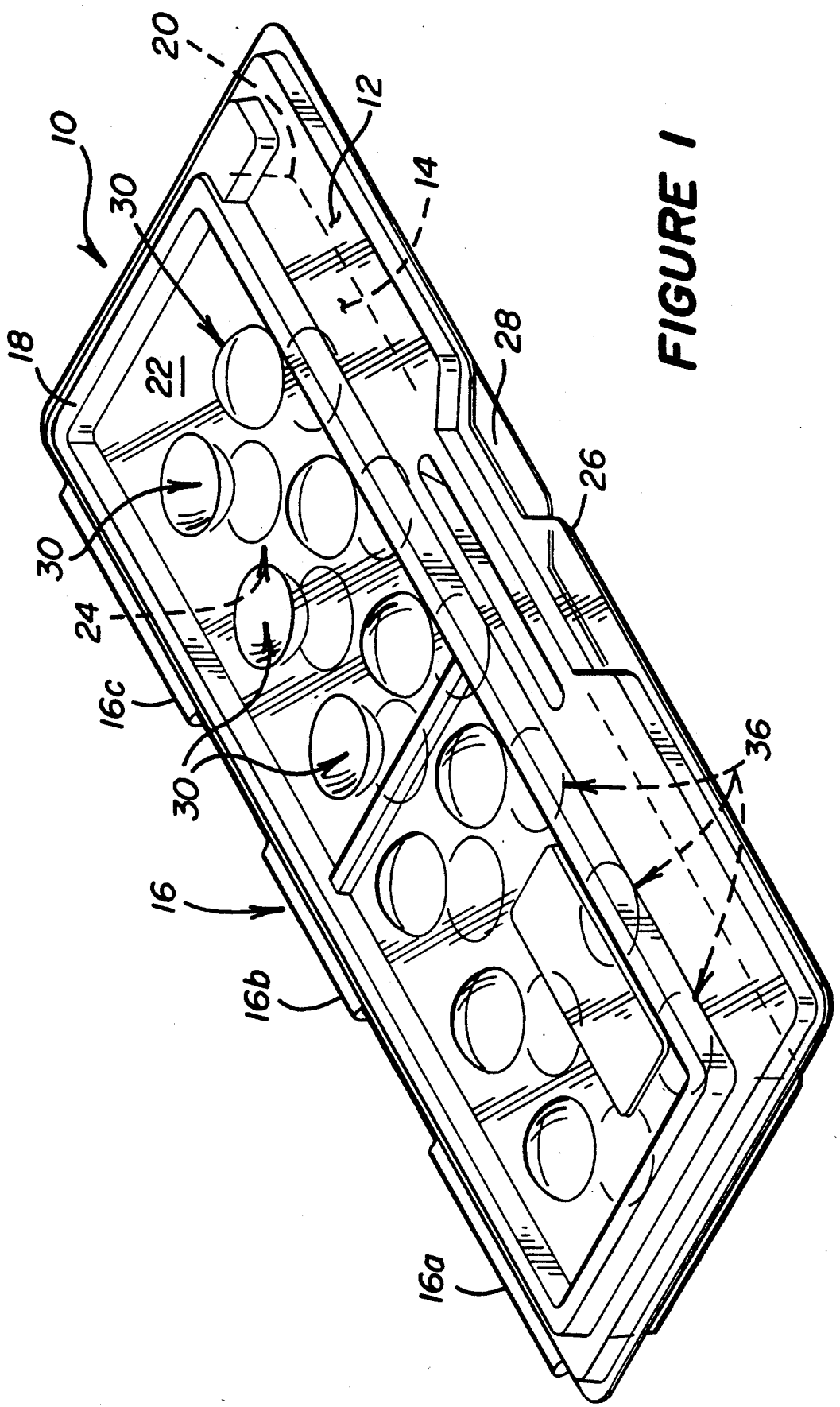
FIG. 1 is an isometric view of the protective container package constructed in accordance with one embodiment of the present invention.

A protective container package constructed in accordance with one embodiment of the present invention is shown in FIG. 1 and designated generally by reference numeral 10.

The protective container package 10 is generally defined as a two piece clam shell enclosure which includes a top container half portion or tray member 12 and a bottom container half portion or tray member 14. Both tray members 12 and 14 are connected together by a hinge member 16 along a common side edge. In the preferred embodiment shown, the hinge member 16 comprises three individual hinge portions 16a, 16b, 16c which serve as a leash for keeping the two tray members 12 and 14 together and facilitate in the alignment and closure of the container package 10. Alternatively, the hinge member 16 may be omitted altogether. In its closed position, the container package 10 provides an airtight enclosure area for articles contained therein.

The preferred material for construction of the tray members 12 and 14 is a transparent, flexible plastic sheet material such as, for example, polyvinyl chloride (PVC). The plastic preferably is impregnated with electrostatic dissipation protection upon formation or may be topically coated with a suitable electrostatic dissipation material in accordance with known techniques.

Each tray member 12 and 14 is also provided with cooperating upraised perimeter rib members 18 and 20 along their outward facing surface which are adapted to permit vertical stacking of adjacent computer package units in interlocking fashion. Each tray member 12 and 14 preferably includes a plurality of elasto-depressible means comprising reversible snap domes 30 and 36, respectively, disposed along their respective support surfaces 22 and 24.

Figure 2:
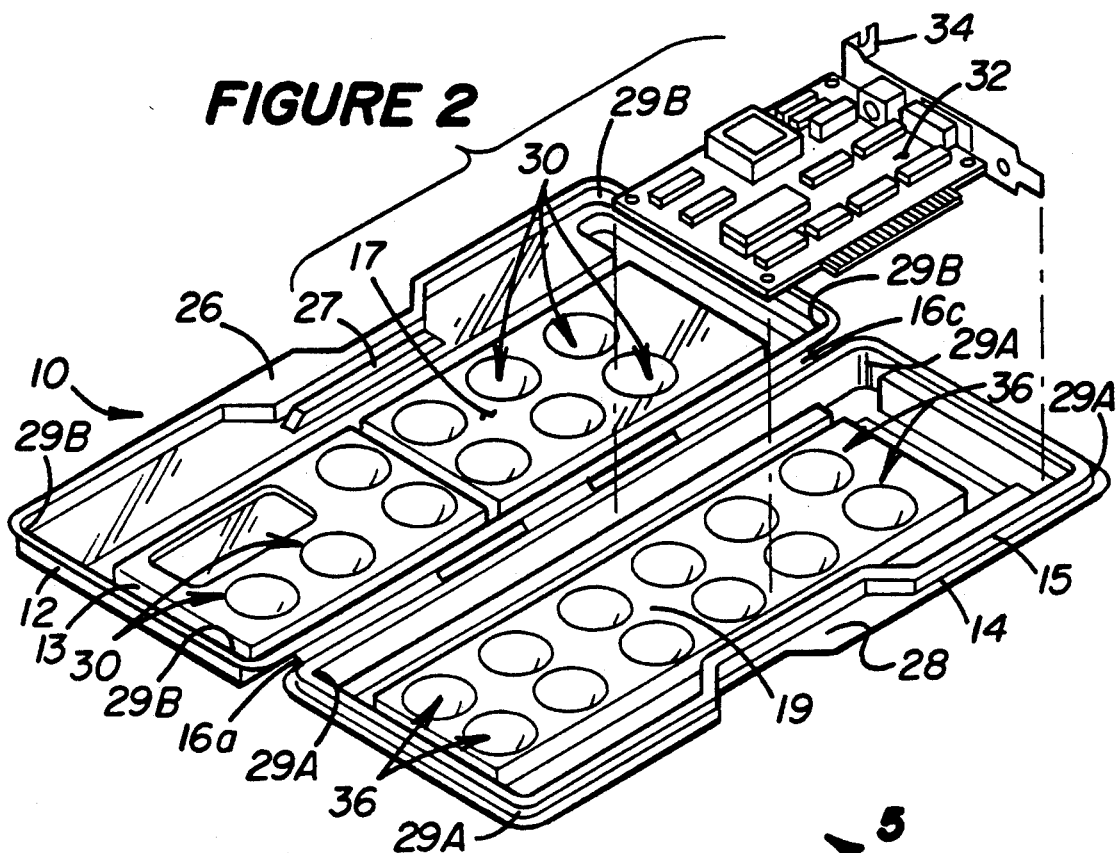
FIG. 2 is an isometric view of the protective container package of FIG. 1 illustrating an open position of the container package and a printed circuit board exploded therefrom.

FIG. 2 illustrates the container package 10 of FIG. 1 in an open position showing a printed circuit board 32 exploded therefrom. The tray member 12 is provided with a perimeter groove along its inward facing surface which is adapted to cooperate with an upraised perimeter rim member 15 provided to the corresponding upward facing surface of tray member 14 to snap close the two half portions of the container package in tongue-in-groove fashion. A positive lock of the tray member 12 and 14 is accomplished through a series of undercuts on the four corners 29A, 29B of the tray members 12 and 14 and on a locking bar 27. Each tray member 12 and 14 further includes a finger actuable tab member 26 and 28 respectively which are offset from one another to facilitate opening and closing the container package 10.

The preferred inner space dimensions of the container package 10 are sufficiently large to accommodate printed circuit boards having a standard or common footprint size such as, for example, the typical board size of 10×12 inches. Further, the inward facing surface configurations of each tray member 12 and 14 may include specially formed ribs or receiving grooves sized to conformingly fit or receive extending electrical connectors 34 provided to the printed circuit board 32.

In use, the printed circuit board 32 is placed within the inward facing receiving or support surface 19 of the lower tray member 14 whereupon the upper tray member 12 is swung thereover and is snapped closed by gently pressing down along its perimeter side edges in order to engage the corresponding tongue-in-groove connector elements 13, 15 provided to the inner opposing inward surfaces of the top and bottom tray members 12, 14.

Figure 3:
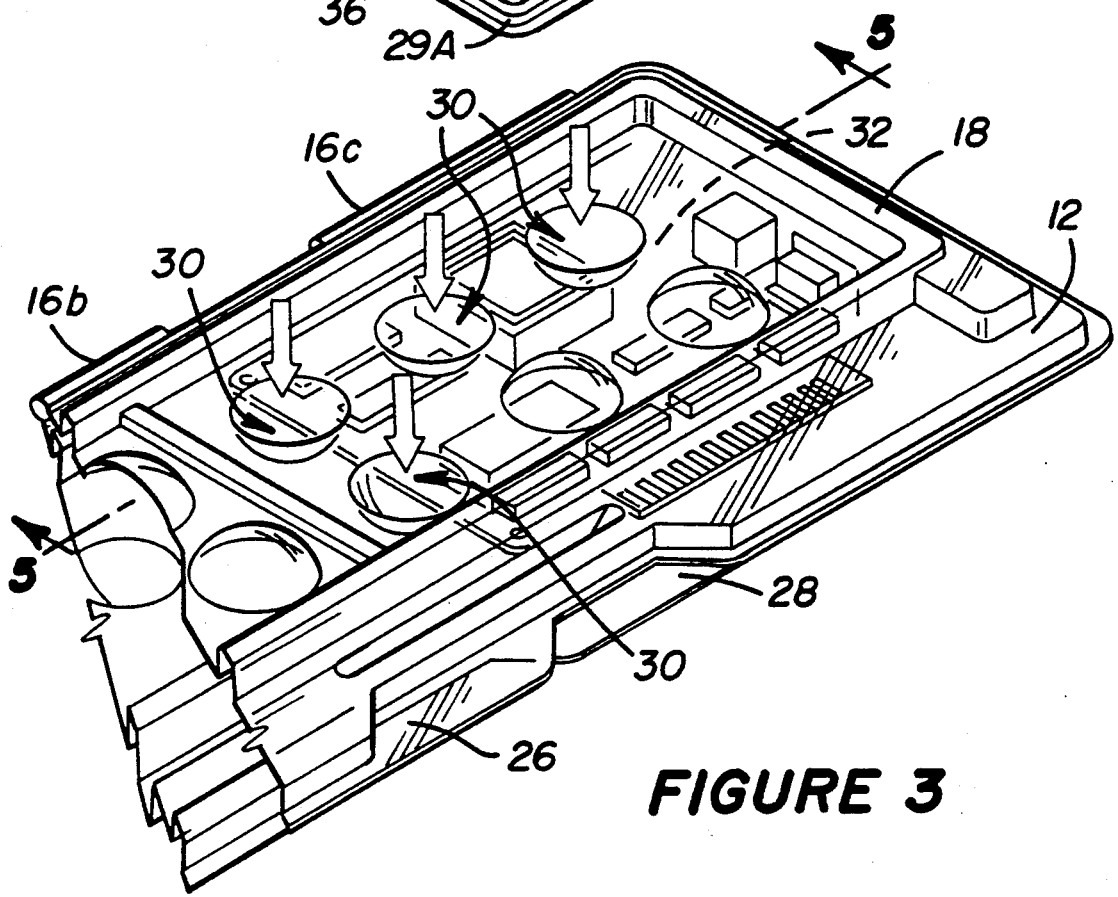
FIG. 3 is an enlarged fragmentary isometric view of the container package illustrating the reversible snap dome feature of the invention.

As is best seen in FIG. 3, the upper reversible snap domes 30 are then selectively depressed into the container package interior as indicated by the arrows such that they either directly contact the underlying mounted components on the circuit board or occupy dead space within the container package interior. Depression of the upper snap domes 30 in this manner prevents the printed circuit board 32 from shifting vertically or laterally within the container package 10.

Figure 4:
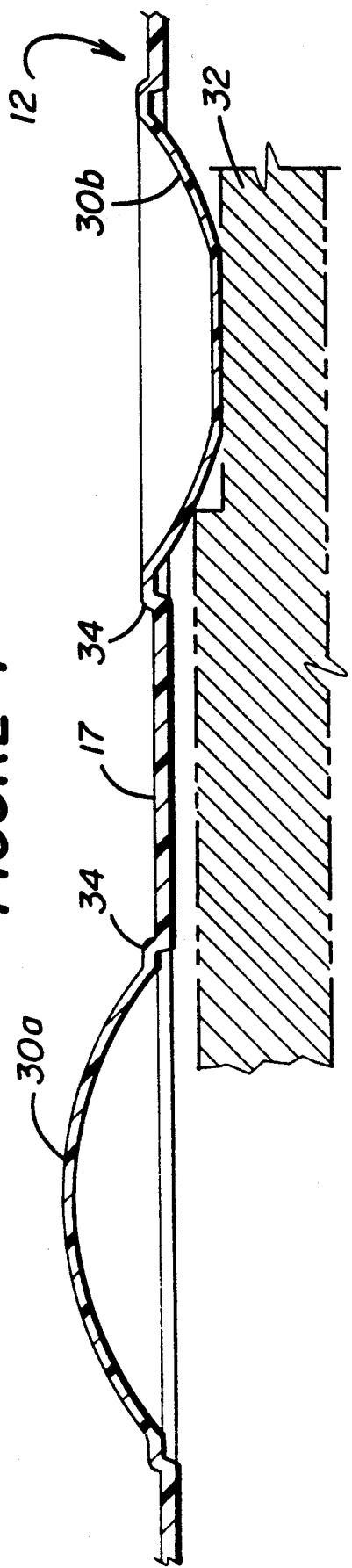
FIG. 4 is an enlarged cross-section view in side elevation of a pair of snap domes showing one snap dome in the undepressed or "up" position and one snap dome in the depressed or "down" position.

Referring now to FIG. 4, there is shown two snap domes 30a and 30b. Snap dome 30a is shown in a convex "up" or undepressed position while snap dome 30b is shown in the concave "down" or depressed position and is bottomed out on an upper surface 33 of a printed circuit board 32. Each snap dome 30a and 30b is shown provided with an upraised perimeter ring member 34 which facilitates the positive snap action of the snap domes as they are moved between their up and down positions. The ring members 34 also serve as stiffeners to the upper support surface 17 of the top tray member 12 such that when a snap dome is depressed inward towards the interior of the container, the upper surface 17 adjacent the depressed snap dome is substantially unaffected. In an alternate embodiment, the perimeter rim members 34 may be omitted. However, in such an embodiment the surface adjacent the snap dome is drawn slightly down inward an adjacent depressed snap dome.

Figure 5:
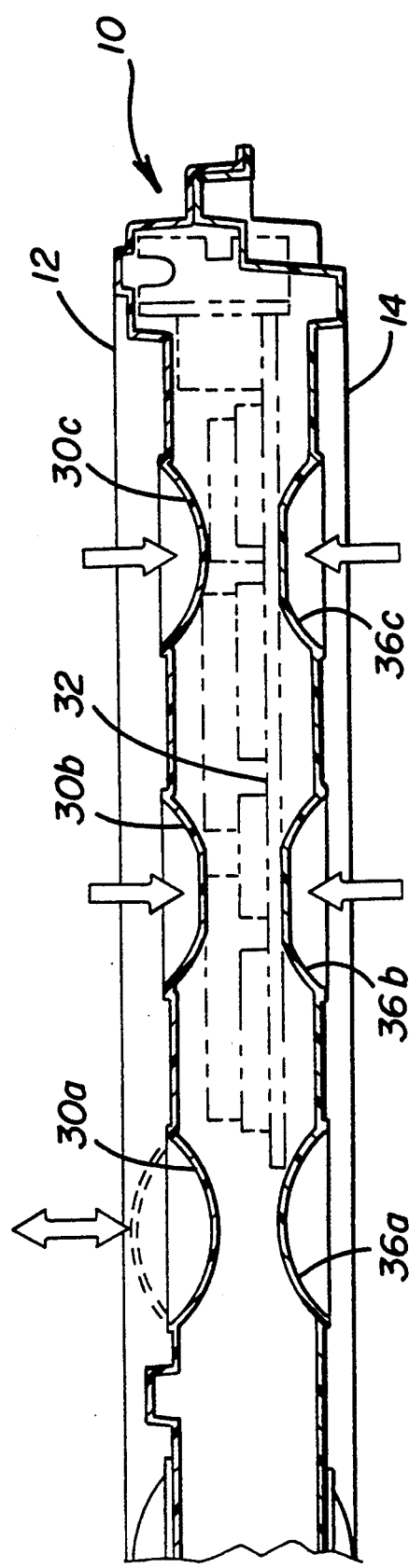
FIG. 5 is a cross-section view of the container package in side elevation taken along the line and in the direction of arrows 5—5 of FIG. 3.

FIG. 5 further illustrates the detail of the snap dome feature of the present invention. The snap domes 30a, 30b of the upper tray member 12 are all shown in the depressed or snap down position. Similarly, snap domes 36a, 36b and 36c of the bottom tray member 14 are shown in the depressed (in this case "up", i.e., into the container package) position. Snap dome 30b of the top tray 12 physically bottoms out on one of the underlying mounted components of the printed circuit board 32 while the depressed snap domes 30a and 30c occupy dead space immediately over other components mounted on the printed circuit board 32. Snap domes 36b and 36c of the lower tray member 14 are shown bottomed out along the underside of the printed circuit board 32. The snap domes 30b, 30c, 36b, 36c, accordingly act like buffers and restrain the printed circuit board 32 from movement in a vertical direction. Depressed snap domes 30a and 36a serve as buffers against lateral shifting of the printed circuit board 32 within the container 10. An important advantage of the present invention is that by selective depression of the snap domes, a large package intended for printed circuit boards having a standard size footprint ma be adapted to a smaller size printed circuit board.

FIGS. 6 and 7 show an alternate embodiment for a compound snap dome 40 of the present invention wherein a smaller snap dome portion 42 is formed concentrically mounted to the upper convex surface of a larger snap dome portion 44 in piggy back fashion. The larger diameter snap dome portion 44 is in turn formed into the support surface of the corresponding upper top or bottom tray member. The double or compound snap dome 40 further includes an intermediate ring portion 43 interposed connecting the smaller snap dome portion 42 to the larger snap dome portion 44. The ring portion 43 provides a positive up or down snap action of the upper smaller snap dome portion 40 with respect to the larger lower snap dome portion 44. FIG. 7 illustrates three operative positions of the compound snap dome 40. Compound snap dome 40a is shown in the fully upright or undepressed position. The snap dome 40b is shown having the smaller snap dome portion 42 depressed downwardly such that it protrudes a distance $D_1$ into the container. Snap dome 40c is shown fully depressed in a downward position such that both the smaller snap dome portion 42c and the larger snap dome portion 44 protrude downward into the container package by a distance $D_2$. It is understood that further variations include multiple compound snap domes capable of greater variation in height positioning when depressed into the container.

FIG. 8 shows an alternate embodiment 50 for the container package of the present invention wherein one or both of the container halves 52 and 54 have a side wall of a sufficient depth to accommodate placement of reversible snap domes 58 thereon. In the embodiment shown, the bottom container half portion 54 includes an upstanding side wall 56 which includes a snap dome 58 formed therein. The lower surface 60 of the bottom container half includes a plurality of snap domes 60a, 60b, 60c . . . , etc., which function in a manner as described above in connection with the principle embodiment. Similarly, the upper container half 52 is provided with a plurality of snap domes 62a, 62b, 62c . . . , etc. The snap domes 58, 60 and 62 formed in the top and bottom container half portions 52, 54 may be selectably depressed to either directly engage an adjacent surface portion of the article 64 to be contained within the container package 50 or occupy dead space to further restrain shifting movement within the container. The alternate embodiment package 50 is ideally suited for larger items having a greater depth such as, for example, a computer disk drive. In the case where the container package is used for a disk drive, the preferred plastic used is a glycol modified polyethylene terrephthalate (PET) or any other similar plastic which does not contain chlorine since disk drives are adversely affected when exposed to chlorine.

Figure 9:
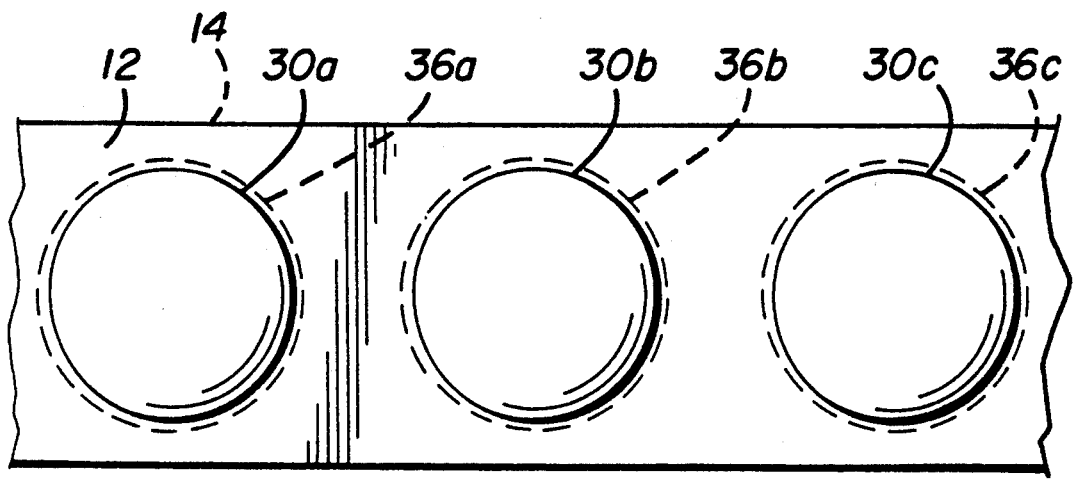
FIGS. 9-11 show alternative configurations for the placement of snap domes along upper and lower surfaces of the container package (snap domes disposed along the lower surface are shown in phantom).
Figure 10:
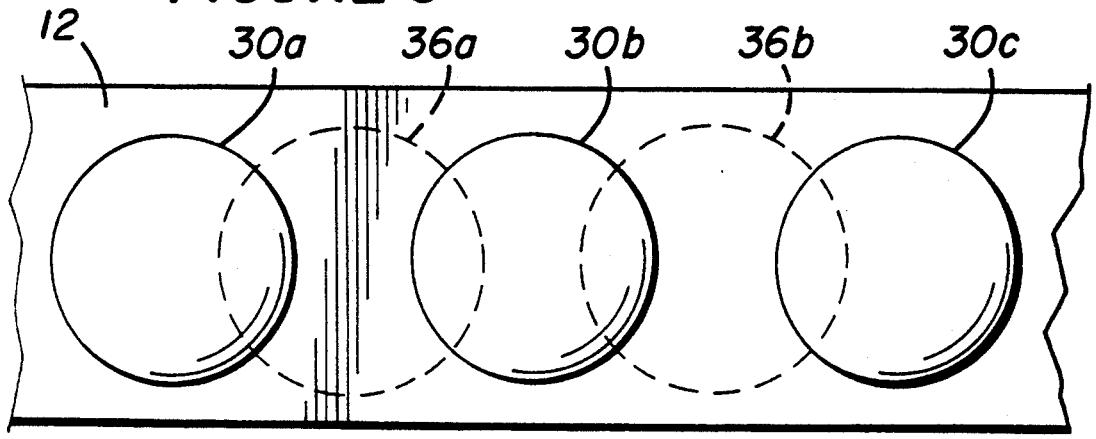
Figure 11:
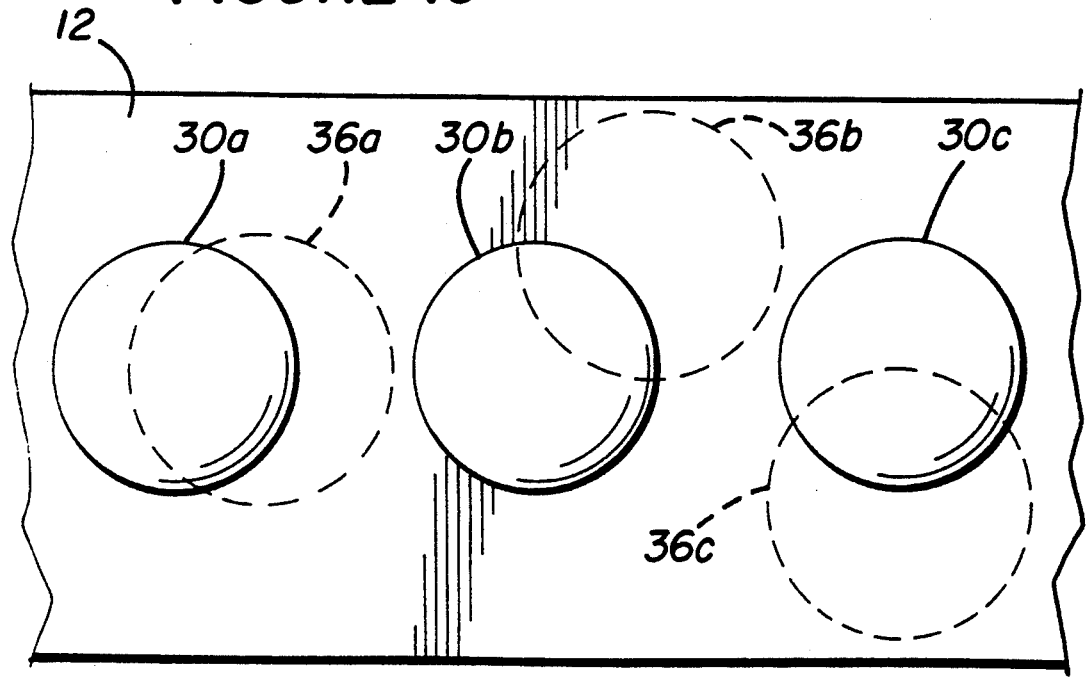

FIGS. 9-11 show alternate embodiments for the arrangement of snap domes on the top and bottom container halves. In FIG. 9, the snap domes 30a, 30b, 30c . . . , etc., of the upper container half portion 12 are aligned vertically coordinate with the snap domes 36a, 36b, 36c of the lower container half portion 14. In FIG. 10, the upper snap domes 30a, 30b, 30c . . . , etc., are offset from the lower snap domes 36a, 36b, 36c . . . , etc. In FIG. 11, the upper snap domes 30a, 30b, 30c . . . , etc., are arranged in an ordered spaced fashion along the upper surface 12 while the lower snap domes 36a, 36b, 36c . . . , etc., are arranged in random fashion along the lower container half. It will be appreciated by those with skill in the art that the snap domes can be arranged in any desirable pattern distribution to appropriately accommodate a particular product's configuration.

It should also be understood that various other modifications within the scope of this invention can be made by one of ordinary skill in the art without departing from the spirit thereof. We therefore wish our invention to be defined by the scope of the appended claims as broadly as the prior art will permit and in view of the specification if need be.

PARTS LIST

10. Protective Container Package
12. Top Tray Member
13. Groove
14. Bottom Tray Member
15. Rim Member
16. Hinge Member
17. Support Surface
18. Rib Member
19. Support Surface
20. Rib Member
22. Support Surface
24. Support Surface 26. Tab Members
28. Tab Members
30. Snap Dome
32. Printed Circuit Board
33. Upper Surface
34. Ring Member
36. Snap Dome
40. Compound Snap Dome
42. Smaller Snap Dome Portion
43. Ring Portion
44. Larger Snap Dome Portion
52. Upper Container Half
54. Lower Container Half
56. Side Wall
58. Snap Dome
60. Snap Dome
62. Snap Dome

I claim:

1. A shipping and storage container package constructed of a flexible plastic sheet material and having matingly engageable top and bottom container half portions comprising in operative combination:
  a) elasto-depressible means for selective depression to restrain movement of an article contained within said container package in both vertical and lateral directions; and
  b) said elasto-depressible means disposed in at least one side wall of said container package, and
wherein said elasto-depressible means includes,
  a) a plurality of reversible snap domes each movable between a first convex position to a second concave position upon application of pressure; and
  b) a plurality of ring members concentrically disposed adjacent an outer periphery of selected individual ones of said snap domes for providing positive snap action to said snap domes when moved between said first and second positions.

2. A shipping and container package as in claim 1 wherein said elasto-depressible means further includes:
  a) a compound snap dome having at least a first snap dome concentrically mounted in piggy back fashion to a second, larger diameter snap dome; and
  b) said compound snap dome providing multiple inwardly depressible height positions.

3. A shipping and container package as in claim 2 wherein:
  a) said top and bottom container half portions are defined as top and bottom tray members each having support surfaces for containing a printed circuit board;
  b) said snap domes are selectively arranged along the support surfaces of said top and bottom tray members; and
  c) said flexible plastic material is selected from the group of transparent, high electrical resistive plastics consisting of polyvinyl chloride and polyethylene terepthalate.

4. A shipping and container package as in claim 3 wherein said plastic material is impregnated with an electrostatic dissipative material.

5. A shipping and container package as in claim 4 wherein:
  a) said top and bottom tray members are connected together by a hinge member; and
  b) each of said top and bottom tray members includes an upraised rib structure across their respective upper and lower outward facing surfaces, said rib structure adapted to permit vertical stacking of said container packages in interlocking fashion.

6. A shipping and container package as in claim 3 wherein said plastic material is topically coated with an electrostatic dissipative material.

7. A shipping and container package as in claim 6 wherein:
  a) said top and bottom tray members are connected together by a hinge member; and
  b) each of said top and bottom tray members includes an upraised rib structure across their respective upper and lower outward facing surfaces, each rib structure adapted to permit vertical stacking of said container packages in interlocking fashion.

8. A shipping and container package as in claim 2 wherein said snap domes are selectively arranged along top bottom and side walls of said container package.

9. A shipping and container package as in claim 1 wherein:
  a) said top and bottom container half portions are defined as top and bottom tray members each having support surfaces for containing a printed circuit board;
  b) said snap domes are selectively arranged along the support surfaces of said top and bottom tray members; and
  c) said flexible plastic material is selected from the group of transparent, high electrical resistive plastics consisting of polyvinyl chloride and polyethylene terepthalate.

10. A shipping and container package as in claim 9 wherein said plastic material is impregnated with an electrostatic dissipative material.

11. A shipping and container package as in claim 10 wherein:
  a) said top and bottom tray members are connected together by a hinge member; and
  b) each of said top and bottom tray members includes an upraised rib structure across their respective upper and lower outward facing surfaces, said rib structure adapted to permit vertical stacking of said container packages in interlocking fashion.

12. A shipping and container package as in claim 9 wherein said plastic material is topically coated with an electrostatic dissipative material.

13. A shipping and container package as in claim 12 wherein:
  a) said top and bottom tray members are connected together by a hinge member; and
  b) each of said top and bottom tray members includes an upraised rib structure across their respective upper and lower outward facing surfaces, said rib structure adapted to permit vertical stacking of said container packages in interlocking fashion.

14. A shipping and container package as in claim 2 wherein said snap domes are selectively arranged along top bottom and side walls of said container package.

* * * * *